United States Patent
Claeson et al.

(10) Patent No.: US 11,558,874 B2
(45) Date of Patent: Jan. 17, 2023

(54) NETWORK ACCESS NODE AND A CLIENT DEVICE FOR CONTENT TYPE INDICATION

(71) Applicant: Huawei Technologies Co., Ltd., Shenzhen (CN)

(72) Inventors: Gustaf Claeson, Lund (SE); Wenquan Hu, Lund (SE); Bengt Lindoff, Kista (SE); Thorsten Schier, Lund (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 107 days.

(21) Appl. No.: 16/950,657

(22) Filed: Nov. 17, 2020

(65) Prior Publication Data

US 2021/0076385 A1 Mar. 11, 2021

Related U.S. Application Data

(63) Continuation of application No. PCT/EP2018/063198, filed on May 18, 2018.

(51) Int. Cl.
*H04W 72/04* (2009.01)
*H04W 76/11* (2018.01)
*H03M 13/09* (2006.01)

(52) U.S. Cl.
CPC ..... *H04W 72/0493* (2013.01); *H03M 13/098* (2013.01); *H04W 72/042* (2013.01); *H04W 72/0466* (2013.01); *H04W 76/11* (2018.02)

(58) Field of Classification Search
None
See application file for complete search history.

(56) References Cited

U.S. PATENT DOCUMENTS

| 2016/0315739 A1 | 10/2016 | Han et al. | |
| 2017/0332359 A1* | 11/2017 | Tsai | H04L 5/0053 |

FOREIGN PATENT DOCUMENTS

| CN | 107006032 A | 8/2017 |
| CN | 107889251 A | 4/2018 |

OTHER PUBLICATIONS

3GPP TSG RAN WG1 Meeting#92, Remain details on other system information delivery, Greece, Athens, Feb. 26-Mar. 2, 2018, R1-1801509 (Year: 2018).*

(Continued)

*Primary Examiner* — Kouroush Mohebbi
(74) *Attorney, Agent, or Firm* — Leydig, Voit & Mayer, Ltd.

(57) ABSTRACT

The present disclosure relates to a network access node and a client device for content type indication. The network access node selects a subset of bits among a set of bits in a second data packet associated with the first data packet based on the content type for the first data packet. The network access node scrambles the selected subset of bits with a first scrambling sequence associated with an identity of the client device. The network access node transmits the first data packet and the second data packet to the client device (300). Upon reception of the first data packet and the second data packet, the client device descrambles the scrambled subset of bits in the second data packet using a first scrambling sequence associated with an identity of the client device to determine the content type for the first data packet.

19 Claims, 6 Drawing Sheets

(56) References Cited

OTHER PUBLICATIONS

VIVO, "Remain details on other system information delivery," 3GPP TSG RAN WG1 Meeting #92, Greece, Athens, R1-1801509, total 3 pages, 3rd Generation Partnership Project, Valbonne, France (Feb. 26-Mar. 2, 2018).
"3rd Generation Partnership Project; Technical Specification Group Radio Access Network; NR; Multiplexing and channel coding (Release 15)," 3GPP TS 38.212 V15.1.1, total 94 pages, 3rd Generation Partnership Project, Valbonne, France (Apr. 2018).
Huawei et al.,"Summary of remaining issues for codebook based transmission for UL MIMO," 3GPP TSG RAN WG1 Meeting #92bis, R1-1804278, Sanya, China, total 5 pages, 3rd Generation Partnership Project, Valbonne, France (Apr. 16-20, 2018).
"3rd Generation Partnership Project; Technical Specification Group Radio Access Network; NR; Physical layer procedures for control (Release 15)," 3GPP TS 38.213 V15.1.0, total 77 pages, 3rd Generation Partnership Project, Valbonne, France (Mar. 2018).
Qualcomm Incorporated,"Considerations on differentiating eMBB and URLLC," 3GPP TSG-RAN WG1 #93, Busan, Korea, R1-1807367, total 2 pages, 3rd Generation Partnership Project, Valbonne, France (May 21-25, 2018).
"3rd Generation Partnership Project; Technical Specification Group Radio Access Network; NR; Medium Access Control (MAC) protocol specification (Release 15)," 3GPP TS 38.321 V15.1.0, total 67 pages, 3rd Generation Partnership Project, Valbonne, France (Mar. 2018).

\* cited by examiner

NETWORK ACCESS NODE AND A CLIENT DEVICE FOR CONTENT TYPE INDICATION

CROSS-REFERENCE TO RELATED APPLICATIONS

This application is a continuation of International Application No. PCT/EP2018/063198, filed on May 18, 2018, the disclosure of which is hereby incorporated by reference in its entirety.

TECHNICAL FIELD

The present disclosure relates to a network access node and a client device for content type indication in a wireless communication system. Furthermore, the present disclosure also relates to corresponding methods and a computer program.

BACKGROUND

The upcoming fifth-generation (5G) wireless cellular communication system, also known as new radio (NR), is expected to carry more traffic and providing new service types compared to the current fourth-generation (4G) wireless cellular communication system, also known as long term evolution (LTE). LTE is mainly optimized for enhanced mobile broadband (eMBB) traffic with target block error rate (BLER) of 10e-1 before re-transmission and an expected one-way latency of around 20 ms.

A critical requirement of 5G is the support of new services and one such service is ultra-reliable low-latency communication (URLLC), for which latency expressed as the time required for transmitting a data packet through the network and reliability is measured in packet error rate (PER). The requirements for URLLC one way over the radio access network (RAN) have been set to a latency of 1 ms combined with a PER of 10e-5 for 32 bytes packet. Thus, URLLC traffic requires much higher reliability and lower latency than eMBB traffic. The addition of such new services with significant reductions in latency while guaranteeing ultra-reliability will put several challenges on the design of the 5G wireless communication system.

SUMMARY

An objective of embodiments of the present disclosure is to provide a solution which mitigates or solves the drawbacks and problems of conventional solutions.

Another objective of embodiments of the present disclosure is to meet one or more of the challenges of future wireless communication systems, such as 5G.

The above and further objectives are solved by the subject matter of the independent claims. Further advantageous embodiments of the present disclosure can be found in the dependent claims.

According to a first aspect of the present disclosure, the above mentioned and other objectives are achieved with a network access node for a wireless communication system, the network access node configured to obtain a content type for a first data packet for a client device;

select a subset of bits among a set of bits in a second data packet associated with the first data packet based on the content type for the first data packet;

scramble the selected subset of bits with a first scrambling sequence associated with an identity of the client device;

transmit the second data packet to the client device;

transmit the first data packet to the client device or receive the first data packet from the client device.

The network access node may obtain the content type in a number of different ways. One non-limiting way is to derive the content type from a header of incoming data to the network access node. The network access node forms the first data packet from the incoming data.

The second packet can be addressed to the client device (transmit case) or to the network access node (receive case).

That the second data packet is associated with the first data packet can in this context imply that the second data packet is a control data packet indicating control information, such as downlink control information, for the first data packet. The second data packet may be transmitted on a control channel. The first data packet may be transmitted on a data channel (e.g. a shared channel).

By selecting a subset of bits and scrambling the selected subset of bits in the second data packet based on the content type for the first data packet, the client device can derive said content type at reception of the second data packet. In this way not only one content type for the packet can be indicated but multiple content types for the first data packet can be indicated based on the use of the different subsets of bits for scrambling. Thereby, the network access node according to the first aspect allows differentiation of processing priority in the client device based on the indicated content type. The processing priority may relate e.g. to how the client device prioritizes the processing of received data for different content types. For example, processing data (first data packets) belonging to URLLC would be prioritized ahead of processing data belonging to eMBB, etc. Hence, latency and/or reliability requirements can be met, for example, in scenarios with mixed traffic.

In an implementation of a network access node according to the first aspect, the set of bits are cyclic redundancy check parity bits arranged adjacent to payload bits in the second data packet, and wherein select the subset of bits among the set of bits comprises select a subset of cyclic redundancy check parity bits with an offset of bits from the payload bits, wherein the offset of bits is determined by the content type for the first data packet.

An advantage with this exemplary implementation is that it allows differentiation of content types with minor changes in current standards, such as 5G. For example, nothing of the following has to be introduced for implementing embodiments of the present disclosure: a radio network temporary identifier (RNTI) for URLLC, new downlink control information for URLLC, or new information elements indicating content type in existing downlink control information formats. Further, this exemplary implementation is easily scalable when more content types have to be indicated.

In an implementation of a network access node according to the first aspect, the network access node is further configured to select a subset of cyclic redundancy check parity bits with a first offset of bits from the payload bits if the content type for the first packet is a first service type;

select a subset of cyclic redundancy check parity bits with a second offset of bits from the payload bits if the content type for the first packet is a second service type.

In one exemplary embodiment the first service type is eMBB and the second service type is URLLC. It is further realised that the second offset of bits is different from the first offset of bits.

In an implementation of a network access node according to the first aspect, different offsets of bits from the payload bits are associated with different content types for the first data packet. Hence, each offset of bits indicates a content type for the first data packet. Which of the offsets corresponds to which content type can be know in advance to both client device and network access node. Furthermore, the network access node may be configured to provide the client device with such associations between offsets and content types even for different RNTI types.

In an implementation of a network access node according to the first aspect, the cyclic redundancy check parity bits comprise 24 bits and the first scrambling sequence comprises 16 bits.

An advantage with this exemplary implementation is that it is possible to reuse current mechanisms, such as current cyclic redundancy check and radio network temporary identifier (giving the possibility to form different scrambling sequences by the use of different offsets.).

In an implementation of a network access node according to the first aspect, each offset of bits from the payload bits is any of 0 to 8 offset of bits.

In an implementation of a network access node according to the first aspect, scramble the subset of cyclic redundancy check parity bits comprises scramble the subset of bits according to the formula:

$$c_k = b_k \text{ for } k=0,1,\ldots,A+l-1;$$

$$c_k = b_k \text{ for } k=A+l+n \text{ and for } n=16,17,\ldots, 23 \text{ when } l+n \leq 23;$$

$$c_k = (b_k + x_{k-A-l}) \bmod 2 \text{ for } k=A+l, A+l+1, A+l+2, \ldots, A+l+15;$$

wherein $c_k$ is an output bit of the second data packet after scrambling with index k, wherein $b_k$ is an input bit before scrambling with index k, $x_k$ is a bit in a bit representation of the identity of the client device (also called the first scrambling sequence), A is the number of payload bits, l is the offset in bits from the payload bits having a value between 0 to 8, and mod 2 is the modulo 2 operator.

An advantage with this exemplary implementation is that a closed form expression is provided for the first scrambling operation using the first scrambling sequence.

In an implementation of a network access node according to the first aspect, the network access node is further configured to select a second scrambling sequence comprising 8 bits based on the content type for the first data packet;

scramble the remaining cyclic redundancy check parity bits not belonging to the subset of cyclic redundancy check parity bits with the second scrambling sequence.

An advantage with this exemplary implementation is that this exemplary implementation solves the problem of so called false detection which e.g. may occur when a first RNTI (scrambling sequence) of a first client device matches a second RNTI (scrambling sequence) of a second client device in an offset bit position.

In an implementation of a network access node according to the first aspect, the first scrambling sequence is a radio network temporary identifier of the client device.

In an implementation of a network access node according to the first aspect, the network access node is further configured to transmit the first data packet in a physical downlink shared channel to the client device or receive the first data packet in a physical uplink shared channel from the client device; and transmit the second data packet in a physical downlink control channel associated with the physical downlink or uplink shared channel to the client device.

An advantage with this exemplary implementation is that current physical channel designs can be used for implementing embodiments of the present disclosure.

In an implementation of a network access node according to the first aspect, the content type for the first data packet is associated with at least one of: a latency requirement and a reliability requirement. The reliability requirement can be an error rate, such as a packet error rate.

According to a second aspect of the present disclosure, the above mentioned and other objectives are achieved with a client device for a wireless communication system, the client device being configured to receive a second data packet from a network access node, wherein the second data packet comprises a scrambled subset of bits among a set of bits.

descramble the scrambled subset of bits in the second data packet using a first scrambling sequence associated with an identity of the client device so as to determine a content type for a first data packet associated with the second data packet;

receive the first data packet from the network access node or transmit the first data packet to the network access node.

An advantage of the client device according to the second aspect is that the client device based on the determined content type for the first data packet can differentiate processing priority. Mentioned processing priority may relate to how the client device prioritizes the processing of received data for different content types. For example, processing data belonging to URLLC would be prioritized ahead of processing data belonging to eMBB. Hence, latency and/or reliability requirements can be met, for example, in scenarios with mixed traffic.

In an implementation of a client device according to the second aspect, the client device is further configured to calculate a metric for the payload bits in the second data packet;

descramble a plurality of different subset of bits in the set of bits using the first scrambling sequence to obtain a plurality of descrambling metrics;

determine the content type for the first data packet based on a match between the metric for the payload bits and one of the plurality of descrambling metrics.

In an implementation of a client device according to the second aspect, the scrambled subset of bits is a subset of cyclic redundancy check parity bits arranged with an offset of bits from the payload bits in the second data packet, and the metric for the payload bits is a cyclic redundancy check for the payload bits.

In an implementation of a client device according to the second aspect, different subset of bits of the plurality of subset of bits correspond to different offsets of bits from the payload bits, and different offsets of bits are associated with different content types for the first data packet.

In an implementation of a client device according to the second aspect, the cyclic redundancy check parity bits comprise 24 bits and the first scrambling sequence comprises 16 bits.

An advantage with this exemplary implementation is that it is possible to reuse current mechanisms, such as current cyclic redundancy check and radio network temporary identifier.

In an implementation of a client device according to the second aspect, each offset of bits from the payload bits is any of 0 to 8 offset of bits.

An advantage with this exemplary implementation is that it allows an easy introduction for indication of additional content types since unused offset of bits can be mapped for additional content types.

In an implementation of a client device according to the second aspect, the remaining cyclic redundancy check parity bits not belonging to the subset of cyclic redundancy check parity bits are scrambled with a second scrambling sequence comprising 8 bits, and configured to descramble the remaining cyclic redundancy check parity bits with the second scrambling sequence.

An advantage with this exemplary implementation is that this exemplary implementation solves the problem of so called false detection which e.g. may occur when a first RNTI of a first client device matches a second RNTI of a second client device in an offset bit position.

In an implementation of a client device according to the second aspect, the first scrambling sequence is a radio network temporary identifier of the client device.

In an implementation of a client device according to the second aspect, the client device is further configured to receive the first data packet in a physical downlink shared channel from the network access node;

receive the second data packet in a physical downlink control channel associated with the physical downlink shared channel from the network access node.

An advantage with this exemplary implementation is that current physical channel design can be used for implementing embodiments of the present disclosure.

In an implementation of a client device according to the second aspect, the content type for the first data packet is associated with at least one of: a latency requirement and a reliability requirement.

According to a third aspect of the present disclosure, the above mentioned and other objectives are achieved with a method for a network access node, the method comprises obtaining a content type for a first data packet for a client device;

selecting a subset of bits among a set of bits in a second data packet associated with the first data packet based on the content type for the first data packet;

scrambling the selected subset of bits with a first scrambling sequence associated with an identity of the client device;

transmitting the second data packet to the client device;

transmitting the first data packet to the client device or receiving the first data packet from the client device.

The method according to the third aspect can be extended into implementations corresponding to the implementations of the network access node according to the first aspect. Hence, an implementation of the method comprises the feature(s) of the corresponding implementation of the network access node.

The advantages of the methods according to the third aspect are the same as those for the corresponding implementations of the network access node according to the first aspect.

According to a fourth aspect of the present disclosure, the above mentioned and other objectives are achieved with a method for a client device, the method comprises receiving a second data packet from a network access node, wherein the second data packet comprises a scrambled subset of bits among a set of bits;

descrambling the scrambled subset of bits in the second data packet using a first scrambling sequence associated with an identity of the client device so as to determine a content type for a first data packet associated with the second data packet;

receiving the first data packet from the network access node or transmitting the first data packet to the network access node.

The method according to the fourth aspect can be extended into implementations corresponding to the implementations of the client device according to the second aspect. Hence, an implementation of the method comprises the feature(s) of the corresponding implementation of the client device.

The advantages of the methods according to the fourth aspect are the same as those for the corresponding exemplary implementations of the client device according to the second aspect.

The present disclosure also relates to a computer program, characterized in program code, which when run by at least one processor causes said at least one processor to execute any method according to embodiments of the present disclosure. Further, the present disclosure also relates to a computer program product comprising a computer readable medium and said mentioned computer program, wherein said computer program is included in the computer readable medium, and comprises of one or more from the group: ROM (Read-Only Memory), PROM (Programmable ROM), EPROM (Erasable PROM), Flash memory, EEPROM (Electrically EPROM) and hard disk drive.

Further applications and advantages of the embodiments of the present disclosure will be provided according to the following detailed description.

BRIEF DESCRIPTION OF THE DRAWINGS

The appended drawings are intended to clarify and explain different embodiments of the present disclosure, in which.

DETAILED DESCRIPTION

As previously discussed in the background section of the present application several challenges on the design of the 5G wireless communication system have to be considered due to new services, such as ultra-reliability and low latency communication (URLLC). The URLLC traffic requires higher reliability and lower latency than e.g. conventional enhanced mobile broadband (eMBB) traffic. Thus, when URLLC traffic is multiplexed with eMBB traffic in the same spectrum, the URLLC traffic needs to be treated differently from the eMBB traffic, since otherwise the reliability and latency of URLLC traffic will be the same as the eMBB traffic. These considerations affect all network layers, including the physical layer as identified by the inventors. Hence, the inventors therefore propose a solution involving a network access node and a client device in which a content type of a first data packet to a client device is indicated through scrambling of a selected subset of bits of a set of bits in an associated second data packet. Thereby, the client device can e.g. prioritize the processing of received data for different content types depending on the determined content type.

Figure 1:
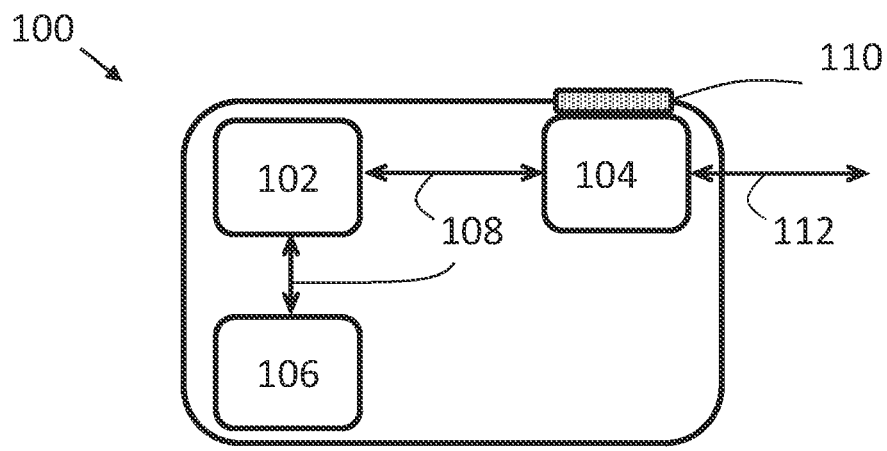
FIG. 1 shows a network access node according to an embodiment of the present disclosure.

FIG. 1 shows a network access node 100 according to an embodiment of the present disclosure. In the embodiment shown in FIG. 1, the network access node 100 comprises a processor 102, a transceiver 104 and a memory 106. The processor 102 is coupled to the transceiver 104 and the memory 106 by communication means 108 known in the art. The network access node 100 may be configured for both wireless and wired communications in wireless and wired communication systems, respectively. The wireless communication capability is provided with an antenna 110 coupled to the transceiver 104, while the wired communication capability is provided with a wired communication interface 112 coupled to the transceiver 104. The network access node 100 further comprises an antenna 108 coupled to the transceiver 102, which means that the network access node 100 is configured for wireless communications in a wireless communication system. That the network access node 100 is configured to perform certain actions should in this disclosure be understood to mean that the network access node 100 comprises suitable means, such as e.g. the processor 102 and the transceiver 104, configured to perform said actions.

Figure 5:
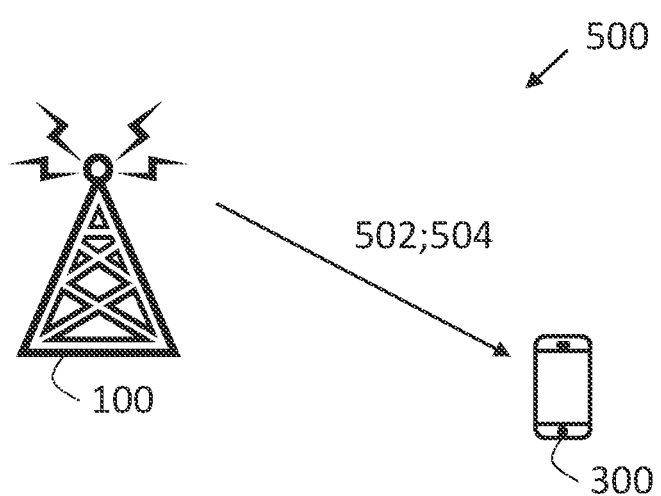
FIG. 5 shows a wireless communication system according to an embodiment of the present disclosure.

With reference to FIG. 1 and FIG. 5 the network access node 100 is configured to obtain a content type for a first data packet 502 for a client device 300. Based on the content type for the first data packet 502 the network access node 100 selects a subset of bits among a set of bits in a second data packet 504 associated with the first data packet 502. The network access node 100 then scrambles this selected subset of bits with a first scrambling sequence associated with an identity of the client device 300 so as to indicate the content type for the first data packet 502. The network access node 100 transmits the second data packet 504 to the client device 300. Furthermore, the network access node 100 transmits the first data packet 502 to the client device or alternatively receives the first data packet 502 from the client device.

Figure 2:
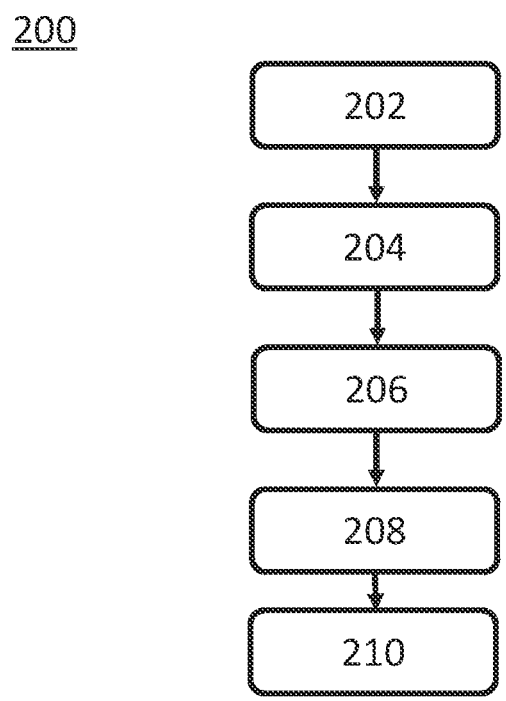
FIG. 2 shows a flow chart for a method according to an embodiment of the present disclosure.

FIG. 2 shows a flow chart of a corresponding method 200 which may be executed in a network access node 100, such as the one shown in FIG. 1. The method 200 comprises:
- Obtaining 202 a content type for a first data packet 502 for a client device 300;
- Selecting 204 a subset of bits among a set of bits in a second data packet 504 associated with the first data packet 502 based on the content type for the first data packet 502;
- Scrambling 206 the selected subset of bits with a first scrambling sequence associated with an identity of the client device 300; and
- Transmitting 208 the second data packet 504 to the client device 300.
- Transmitting 210 the first data packet 502 to the client device or receiving 210 the first data packet 502 from the client device.

It is herein noted that the first data packet 502 can comprise more than one content type which hence implies that more than one content type can be indicated for the first data packet 502. Further, embodiments of the present disclosure are not limited to a singular first data packet and a singular associated second data packet and can therefore relate to one or more first data packets and one or more second data packets associated with the one or more first data packets.

A content type can be derived from quality-of-service (QoS) requirements such as latency and/or reliability requirement. Therefore, the content type can fully correspond to a service type, such as eMBB, URLLC, or any other suitable service type used in the wireless communication system 500. Further, a plurality of content types can correspond to a plurality of different URLLC QoS requirements. User plane latency could be evaluated as the time it takes to successfully deliver an application layer packet/message from the radio protocol layer 2/3 service data unit (SDU) ingress point to the radio protocol layer 2/3 SDU egress point via the radio interface in both uplink and downlink directions, where neither client device nor network access node reception is restricted by discontinuous reception (DRX). Reliability could be evaluated by the success probability of transmitting a number of bytes within a certain delay, which is the time it takes to deliver a small data packet from the radio protocol layer 2/3 SDU ingress point to the radio protocol layer 2/3 SDU egress point of the radio interface, at a certain channel quality (e.g., coverage-edge).

Figure 3:
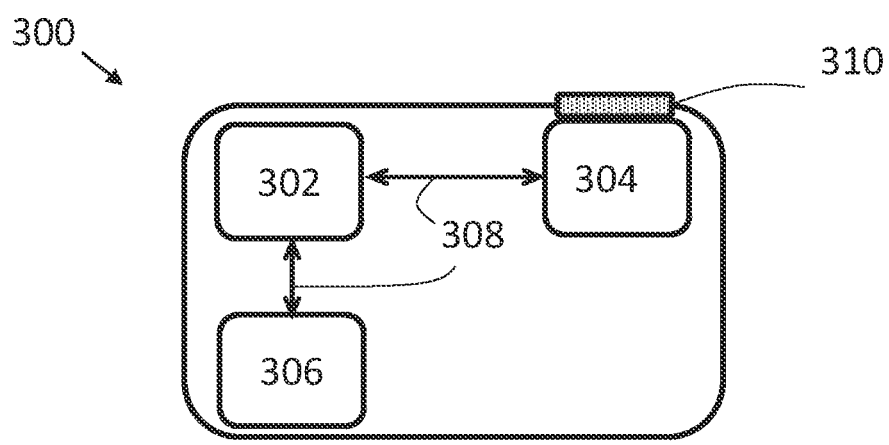
FIG. 3 shows a client device according to an embodiment of the present disclosure.

FIG. 3 shows a client device 300 according to an embodiment of the present disclosure. In the embodiment shown in FIG. 3, the client device 300 comprises a processor 302, a transceiver 304 and a memory 306. The processor 302 is coupled to the transceiver 304 and the memory 306 by communication means 308 known in the art. The client device 300 further comprises an antenna 310 coupled to the transceiver 304, which means that the client device 300 is configured for wireless communications in a wireless communication system. That the client device 300 is configured to perform certain actions should in this disclosure be understood to mean that the client device 300 comprises suitable means, such as e.g. the processor 302 and the transceiver 304, configured to perform said actions.

With reference to FIGS. 3 and 5 the client device 300 is configured to receive a second data packet 504 from a network access node 100. The second data packet 504 comprises a scrambled subset of bits among a set of bits so as to indicate a content type for the first data packet 502. Thereafter, upon reception of the first data packet 502 and the second data packet 504 the client device 300 descrambles the scrambled subset of bits in the second data packet 504 by using a first scrambling sequence associated with an identity of the client device 300. In this way the client device 100 determines the content type for a first data packet 502 associated with the second data packet 504 and which is to be transmitted or to be received by the client device 100.

Figure 4:
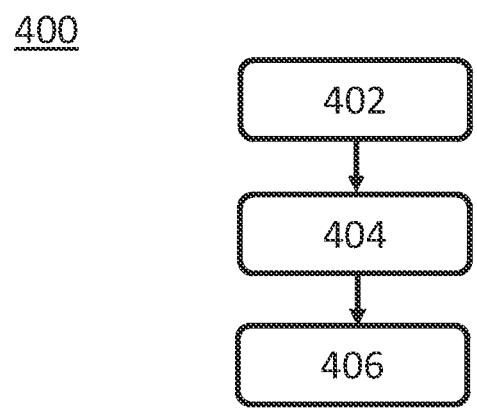
FIG. 4 shows a flow chart for a method according to an embodiment of the present disclosure.

FIG. 4 shows a flow chart of a corresponding method 400 which may be executed in a client device 300, such as the one shown in FIG. 3. The method 400 comprises
- Receiving 402 a second data packet 504 from a network access node 100, wherein the second data packet 504 comprises a scrambled subset of bits among a set of bits; and
- Descrambling 404 the scrambled subset of bits in the second data packet 504 using a first scrambling sequence associated with an identity of the client device 300 so as to determine the content type for the first data packet 502 associated with the second data packet 504;

receiving 406 the first data packet 502 from the network access node 100 or transmitting 406 the first data packet 502 to the network access node 100.

FIG. 5 shows a wireless communication system 500 according to an embodiment of the present disclosure. The wireless communication system 500 comprises a client device 300 and a network access node 100 configured to operate and interwork with each other in the wireless communication system 500. The client device 300 and the network access node 100 are further configured according to embodiments of the present disclosure. For simplicity, the wireless communication system 500 shown in FIG. 5 comprises one client device 300 and one network access node 100. However, the wireless communication system 500 may comprise any number of client devices and any number of network access nodes without deviating from the scope of the present disclosure. It is illustrated in FIG. 5 how the network access node 100 transmits a first data packet 502 and a second data packet 504 to the client device 300. The transmission of the first data packet 502 and the second data packet 504 can be concurrent transmissions or separated in time. Further, the same or different frequency resources can be used for the transmission of the first data packet 502 and the second data packet 504.

Figure 6:
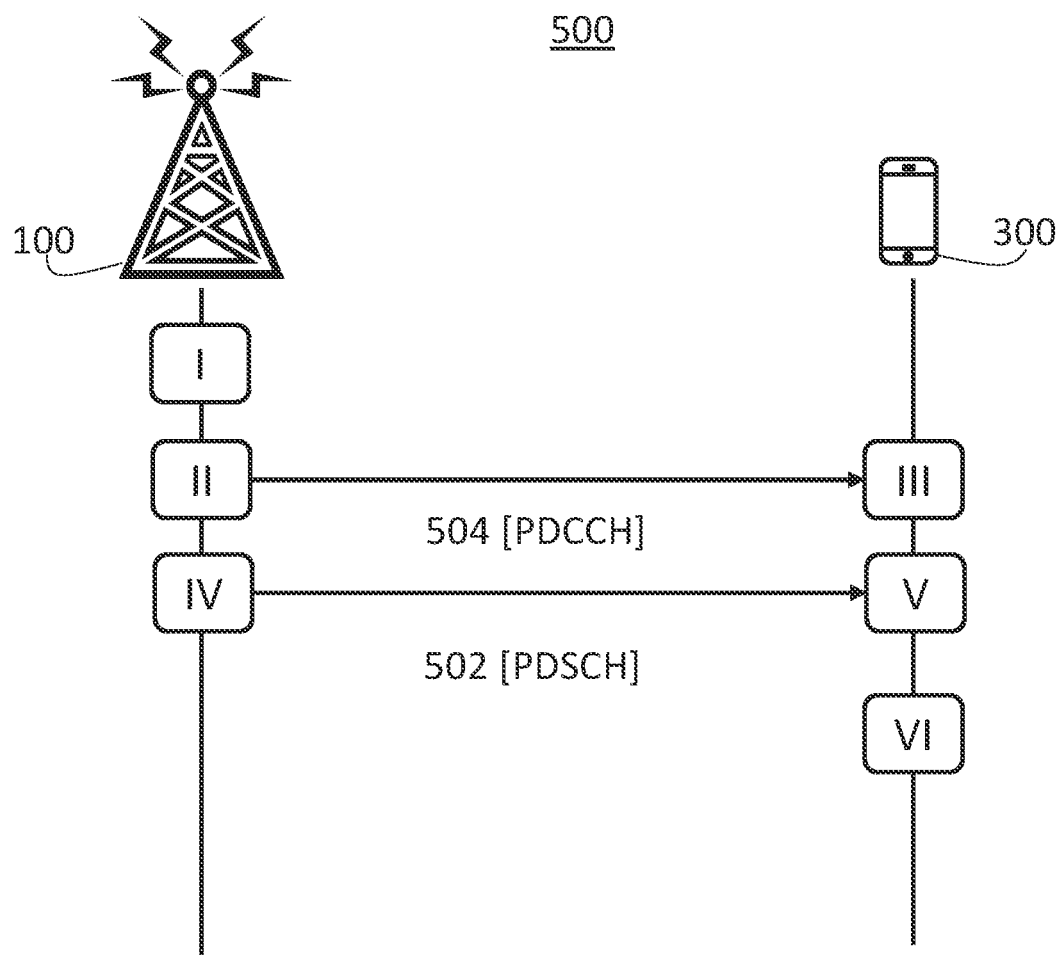
FIG. 6 shows interworking between a network access node and a client device according to an embodiment of the present disclosure.

FIG. 6 shows the interworking between a network access node 100 and a client device 300 in a wireless communication system 500 so as to illustrate further embodiments of the present disclosure.

At step I in FIG. 6, the network access node 100 obtains one or more content types for a first data packet 502 intended for a client device 300. The content types can be derived by reading headers of incoming data which the network access node 100 will later form to the first data packet 502. The network access node 100 then selects a subset of bits among a set of bits in an associated second data packet 504 based on the one or more obtained content types. The selected subset of bits is thereafter scrambled with a first scrambling sequence associated with an identity of the client device 300, e.g. a radio network temporary identifier (RNTI). A closed form expression on exactly how the selected subset of bits can be scrambled according to an embodiment of the present disclosure is given in the following disclosure.

In embodiments of the present disclosure the set of bits are parity check bits arranged adjacent to payload bits in the second data packet 502 and which were calculated based on the payload bits. In a NR scenario the set of bits would hence count to 24 (CRC) bits which means that the subset of bits would count to 16 parity check bits if the current RNTI formats are used. Therefore, the inventors in such a scenario further propose that the content type for the first data packet 502 is indicated by scrambling of 16 parity check bits in the second data packet 504 depending on different offset of bits from the payload of bits. The scrambling of 16 parity check bits would in this case be performed with the use of a RNTI of the client device 300 as a first scrambling sequence. This means that one offset of bits indicates a content type whilst another offset of bits indicates another content type, and so on. In the herein exemplified scenario 0 to 8 bits of offset of bits from the payload bits are possible giving a total number of at maximum 9 different content types. A set of rules related to offset of bits can be predefined in the physical layer, where different offset of bits are mapped to different content types for the first data packet 502. In one example a first offset relates to a first service type and a second offset relates to a second service type. Table 1 shows non-limiting examples of different combinations of RNTI types (first scrambling sequences) and offsets of bits so as to indicate different content types. It is to be noted that the present disclosure is not limited to the examples given in Table 1.

TABLE 1

| RNTI type | Offset A | Offset B | Offset C |
|---|---|---|---|
| C-RNTI | content type 1 | content type 2 | N/A |
| CS-RNTI | content type 1 | content type 2 | content type 3 |
| SP-CSI-RNTI | content type 1 | content type 2 | content type 4 |
| RA-RNTI | content type 2 | content type 3 | content type 4 |
| P-RNTI | content type 5 | content type 6 | content type 7 |

Figure 7:
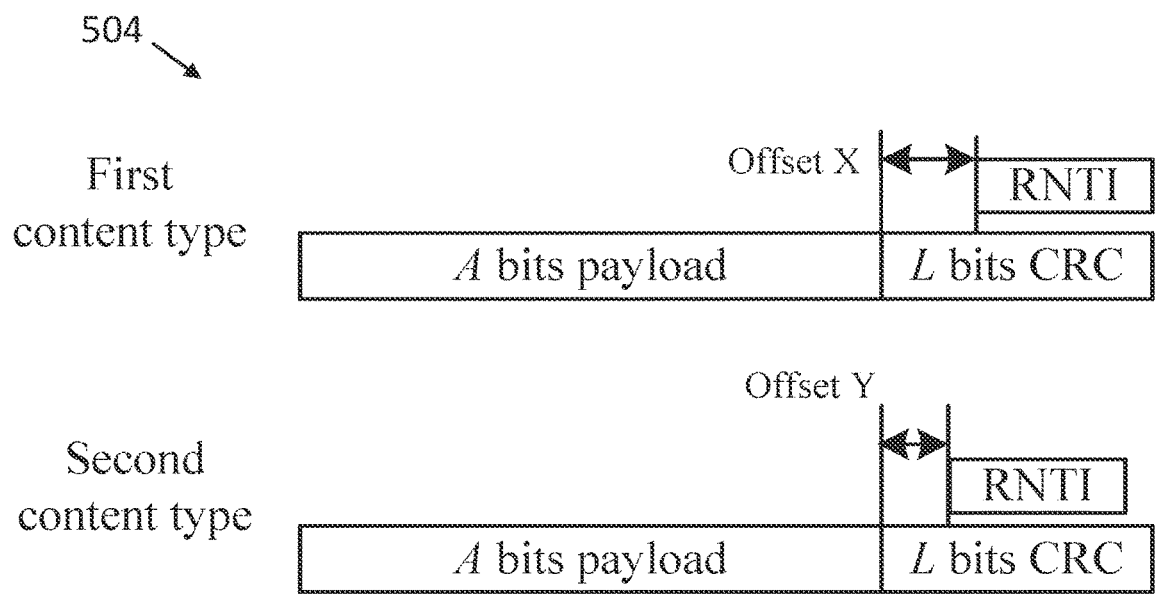
FIG. 7 illustrates different offsets of bits for a RNTI according to an embodiment of the present disclosure.

In Table 1 capital letters A, B and C represent different number of offset bits, such as any of [0, . . . , 8] bits. For each type of RNTI, such as C-RNTI, CS-RNTI, etc., a number of offsets of bits have a predefined meaning which therefore indicates a content type. For example, content type 1 and content type 2 for C-RNTI can indicate two different service types corresponding to two different offset of bits, e.g. a first offset of bits indicates service type eMBB and a second offset of bits indicates service type URLLC. The first offset of bits indicating eMBB can be 8 bits and the second offset of bits indicating URLLC can be any of 0 to 7 bits. FIG. 7 illustrates the case with to different offset of bits from the payload bits in the second data packet 504 (A denotes the total number of payload bits and L denotes the total number of parity check bits). In FIG. 7 a first content type is indicated by scrambling of a subset of bits with an offset of X bits. On the other hand, a second content type is indicated by scrambling of a subset of bits with an offset of Y bits, where Y is an integer which differs from integer X.

The mapping shown in Table 1 can be hard coded and given by a standard, such as a 3GPP specification. On the other hand, the mapping shown in Table 1 can also be semi-statically signalled to the client device 300, e.g. in radio resource control (RRC) signalling from the network access node 100. It is further noted that Table 1 shows three different offsets, i.e. A, B and C, but the present disclosure is not limited to these three offsets of bits.

At step II in FIG. 6, the network access node 100 transmits the second data packet 504 in a physical downlink control channel (PDCCH) to the client device 300; and at step III in FIG. 6, the client device 300 receives the second data packet 504 in PDCCH from the network access node 100. The PDCCH indicates the resources for its associated physical downlink shared channel (PDSCH). The payload of the second data packet 504 can be downlink control information (DCI) transmitted from the network access node 100.

At step IV in FIG. 6, the network access node 100 transmits the first data packet 502 in a physical downlink shared channel (PDSCH) to the client device 300 in the resources indicated by the PDCCH; and at step V in FIG. 6, the client device 300 receives the first data packet 502 in the PDSCH from the network access node 100.

Alternatively, the first data packet 502 may also be transmitted from the client device 300 to the network access node 100. This transmission may for example happen on the physical uplink shared channel (PUSCH).

Previous to step VI in FIG. 6, the client device 300 has already received a PDCCH configuration with one or more search space sets and any RNTI type from the network access node 100. Therefore, at step VI (which can be in time also performed before step IV) in FIG. 6, the client device 300 calculates a metric for the payload bits in the second data packet 502. In one example the metric for the payload bits is a cyclic redundancy check (CRC) for the payload bits. The client device 300 further descrambles a plurality of different subset of bits using the first scrambling sequence, e.g. C-RNTI. The corresponding different descrambled subsets of bits are then combined with the corresponding remaining bits in the set of bits (which could be understood be subject of an XOR with 0 operation during descrambling), to obtain a plurality of descrambled metrics. The descrambled metrics could be seen as candidate CRCs. Hence, taken the before example, while the descrambled subsets of bits have a length of 16 bits. The corresponding descrambled metrics have a length of 24 bits. By comparing the metric for the payload bits and each of the plurality of descrambled metrics the content type for the first data packet 502 is determined if the comparison results in a match between the metric for the payload bits and one of the plurality of descrambled metrics. By knowing the content type(s) of the first data packet 502, the client device 300 can prioritize its processing of received data so that different traffic types can meet its latency and/or reliability requirements. For example, if the client device 300 is configured for both eMBB and URLLC traffic, the processing would probably prioritize the URLLC traffic so as to meet the stricter requirements of URLLC traffic.

Figure 9:
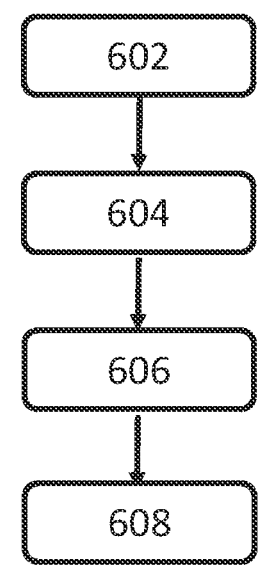
FIG. 9 shows a flow chart for a method according to an embodiment of the present disclosure.

FIG. 9 shows a flow chart of a method for a client device 300. The method illustrates the case when the client device 300 is configured for multiple content types for an RNTI.

At step 602 in FIG. 9, the client device 300 is configured by the network access node 100 to support multiple content types, e.g. eMBB and URLLC traffic. The client device 300 is further configured by the network access node 100 with a C-RNTI and one or more search space sets.

At step 604 in FIG. 9, the client device 300 receives a second data packet 504 in PDCCH and calculates a CRC for the payload bits of the second data packet 504.

At step 606 in FIG. 9, the client device 300 obtains a list of candidate CRCs by descrambling the parity check bits of the second data packet 504 with different offset of bits. Hence, a candidate CRC is obtained for each descrambled offset of bits.

At step 608 in FIG. 9, the client device 300 performs a check between each candidate CRC in the list with the calculated CRC from step 604. If a candidate CRC matches the calculated CRC it is determined that the first data packet 502 has a content type which corresponds to the offset of bits associated with the candidate CRC. This check is performed by the client device 300 for each candidate CRC in the list. After having determined the content types for the first data packet 502 the client device 300 can start processing received data from the network access node 100 based on the determined content types.

Moreover, as previously mentioned a closed form expression is herein presented for the scrambling operation using the first scrambling sequence in the scenario in which the set of bits comprises 24 parity check bits and the subset of bits comprises 16 bits arranged with an offset of bits ([0, . . . , 8]) from the payload bits of the second data packet. A further assumption is that the first scrambling sequence is a RNTI for the client device 300. The general scrambling formula is expressed as:

$$c_k = b_k \text{ for } k=0,1,\ldots,A+l-1;$$

$$c_k = b_k \text{ for } k=A+l+n \text{ and for } n=16,17,\ldots,23 \text{ when } l+n \leq 23;$$

$$c_k = (b_k + x_{k-A-l}) \mod 2 \text{ for } k=A+l, A+l+1, A+l+2,\ldots,A+l+15;$$

wherein $c_k$ is a output bit after scrambling with index k, wherein $b_k$ is an input bit before scrambling with index k, $x_k$ is a bit in a bit representation of the identity of the client device 300 in this case RNTI, A is the number of payload bits, l is the offset in bits from the payload bits having a value between 0 to 8, and mod 2 is the modulo 2 operator. Further, the offset of bits l from the payload of bits depends on the content type(s) for the first data packet 502 and can be any of 0 to 8 bits. Different content types correspond to different offset of bits l according to this formula.

Figure 8:
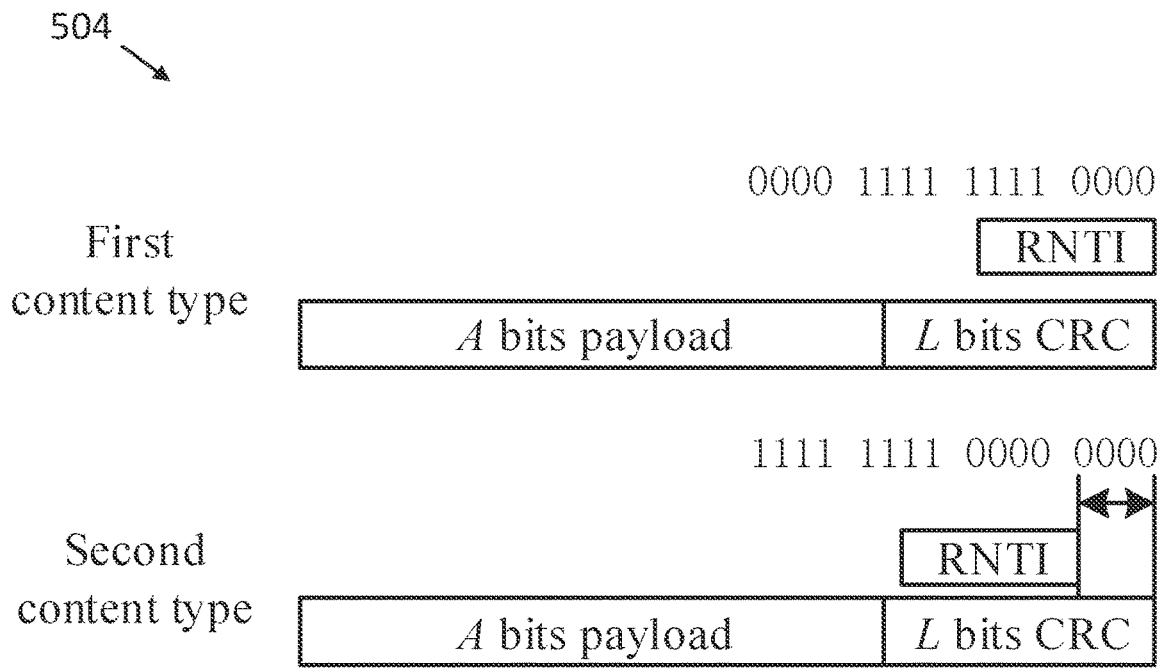
FIG. 8 illustrates a case of overlapping RNTIs which may result in a false detection according to an embodiment of the present disclosure.

Furthermore, it has also been identified by the inventors that a theoretical increase in false detection in the client device 300 may occur when using multiple positions of the RNTI mask as previously described. The false detection problem for RNTIs is illustrated in FIG. 8. The offset of the RNTI position may result in a match of a RNTI of another client device in yet another offset position. With reference to FIG. 8 assume that a first client device has a RNTI sequence "0000 1111 1111 0000" and assume further that the scrambling of a first content type and a second content type are mapped between RNTI bits and CRC bits as shown in FIG. 8. Also, assuming that a second client device in the same cell has a RNTI sequence "1111 1111 0000 0000", i.e. exactly a 4 bit shift of the RNTI of the first client device. In this case there may be a false detection problem for the second client device when an offset of bits according to the second content type is indicated to the first client device. The same problem arises when an offset of bits according to the first content type is indicated to the second client device. This would then result in a false detection by the first client device as a second content type control channel scheduling. Therefore, according to an embodiment of the present disclosure for solving the problem with possible false detection, a second scrambling sequence is applied to the remaining 8 bits of the parity check bits. The second scrambling sequence can be given by a standard or be semi-statically configured. In an example, the standard may specify:

For a first content type, the remaining 8 bits are scrambled with a second scrambling sequence=0000 0000;

For a second content type, the remaining 8 bits are scrambled with a second scrambling sequence=1111 1111.

If more content types are needed to differentiate, further second scrambling sequences can be applied on the remaining 8 bits of the parity check bits according to the above idea.

In an alternative embodiment the above issue can be avoided by the network access node 100 choosing RNTIs which are not subject to the above issue.

As already indicated in an alternative embodiment, the indicated content type can relate to uplink transmissions from the client device 300 to the network access node 100 instead of downlink transmissions as previously described. According to such an embodiment of the present disclosure, the scrambled subset of bits indicates a content type for a first data packet transmitted from the client device 300 to the network access node 100. As for the downlink case the second data packet can be transmitted in PDCCH to the client device 300 whilst the uplink transmission of the first data packet can be performed in a physical uplink shared channel (PUSCH). Further, embodiments for the downlink case related to, e.g., scenarios with 24 parity check bits as the set of bits and 16 parity check bits as subset of bits, offset of bits from payload bits, content types, etc. are also applicable in the uplink case.

The client device 300 herein, may be denoted as a user device, a User Equipment (UE), a mobile station, an internet of things (IoT) device, a sensor device, a wireless terminal and/or a mobile terminal, is enabled to communicate wirelessly in a wireless communication system, sometimes also referred to as a cellular radio system. The UEs may further be referred to as mobile telephones, cellular telephones, computer tablets or laptops with wireless capability. The UEs in this context may be, for example, portable, pocket-storable, hand-held, computer-comprised, or vehicle-mounted mobile devices, enabled to communicate voice and/or data, via the radio access network, with another entity, such as another receiver or a server. The UE can be a Station (STA), which is any device that contains an IEEE 802.11-conformant Media Access Control (MAC) and Physical Layer (PHY) interface to the Wireless Medium (WM). The UE may also be configured for communication in 3GPP related LTE and LTE-Advanced, in WiMAX and its evolution, and in fifth generation wireless technologies, such as New Radio.

The network access node 100 herein may also be denoted as a radio network access node, an access network access node, an access point, or a base station, e.g. a Radio Base Station (RBS), which in some networks may be referred to as transmitter, "gNB", "gNodeB", "eNB", "eNodeB", "NodeB" or "B node", depending on the technology and terminology used. The radio network access nodes may be of different classes such as e.g. macro eNodeB, home eNodeB or pico base station, based on transmission power and thereby also cell size. The radio network access node can be a Station (STA), which is any device that contains an IEEE 802.11-conformant Media Access Control (MAC) and Physical Layer (PHY) interface to the Wireless Medium (WM). The radio network access node may also be a base station corresponding to the fifth generation (5G) wireless systems.

Furthermore, any method according to embodiments of the present disclosure may be implemented in a computer program, having code means, which when run by processing means causes the processing means to execute the steps of the method. The computer program is included in a computer readable medium of a computer program product. The computer readable medium may comprise essentially any memory, such as a ROM (Read-Only Memory), a PROM (Programmable Read-Only Memory), an EPROM (Erasable PROM), a Flash memory, an EEPROM (Electrically Erasable PROM), or a hard disk drive.

Moreover, it is realized by the skilled person that embodiments of the client device 300 and the network access node 100 comprises communication capabilities in the form of e.g., functions, means, units, elements, etc., for performing the solution. Examples of other such means, units, elements and functions are: processors, memory, buffers, control logic, encoders, decoders, rate matchers, de-rate matchers, mapping units, multipliers, decision units, selecting units, switches, interleavers, de-interleavers, modulators, demodulators, inputs, outputs, antennas, amplifiers, receiver units, transmitter units, DSPs, MSDs, TCM encoder, TCM decoder, power supply units, power feeders, communication interfaces, communication protocols, etc. which are suitably arranged together for performing the solution.

For example, the processor(s) of the client device 300 and the network access node 100 may comprise, e.g., one or more instances of a Central Processing Unit (CPU), a processing unit, a processing circuit, a processor, an Application Specific Integrated Circuit (ASIC), a microprocessor, or other processing logic that may interpret and execute instructions. The expression "processor" may thus represent a processing circuitry comprising a plurality of processing circuits, such as, e.g., any, some or all of the ones mentioned above. The processing circuitry may further perform data processing functions for inputting, outputting, and processing of data comprising data buffering and device control functions, such as call processing control, user interface control, or the like.

Finally, it should be understood that the present disclosure is not limited to the embodiments described above, but also relates to and incorporates all embodiments within the scope of the appended independent claims.

What is claimed is:

1. A network access node for a wireless communication system, the network access node comprising a processor and a non-transitory memory coupled to the processor and having processor-executable instructions stored thereon, which when executed, cause the network access node to perform a method, comprising:
   obtaining a content type for a first data packet for a client device;
   selecting a subset of bits among a set of bits in a second data packet associated with the first data packet based on the content type for the first data packet;
   scrambling the selected subset of bits with a first scrambling sequence associated with an identity of the client device;
   transmitting the second data packet to the client device; and
   transmitting the first data packet to the client device or receiving the first data packet from the client device,
   wherein the set of bits is cyclic redundancy check parity bits arranged adjacent to payload bits in the second data packet,
   wherein selecting the subset of bits among the set of bits comprises:
      selecting a subset of the cyclic redundancy check parity bits with an offset of bits from the payload bits, wherein the offset of bits is determined by the content type for the first data packet,
      wherein remaining cyclic redundancy check parity bits not belonging to the selected subset of the cyclic redundancy check parity bits are scrambled with a second scrambling sequence, and
      wherein the second scrambling sequence is used to avoid a false detection of another client device as the client device.

2. The network access node according to claim 1, wherein the method further comprises:
   selecting the subset of the cyclic redundancy check parity bits with a first offset of bits from the payload bits in response to the content type for the first packet being a first service type; and
   selecting the subset of the cyclic redundancy check parity bits with a second offset of bits from the payload bits in response to the content type for the first packet being a second service type.

3. The network access node according to claim 1, wherein different offsets of bits from the payload bits are associated with different content types for the first data packet.

4. The network access node according to claim 1, wherein the cyclic redundancy check parity bits comprise 24 bits and the first scrambling sequence comprises 16 bits.

5. The network access node according to claim 4, wherein each offset of bits from the payload bits is a 0 to 8 offset of bits.

6. The network access node according to claim 4, wherein scrambling the subset of cyclic redundancy check parity bits comprises scrambling the subset of bits according to the formula:

$c_k = b_k$ for $k=0,1,\ldots,A+l-1$;

$c_k = b_k$ for $k=A+l+n$ and for $n=16,17,\ldots,23$ when $l+n \leq 23$;

$c_k = (b_k + x_{k-A-l}) \bmod 2$ for $k=A+l, A+l+1, A+l+2, \ldots, A+l+15$;

wherein $c_k$ is an output bit of the second data packet after scrambling with index k, wherein $b_k$ is an input bit before scrambling with index k, $x_k$ is a bit in a bit representation of the identity of the client device, A is the number of payload bits, l is the offset in bits from the payload bits having a value between 0 to 8, and mod 2 is the modulo 2 operator.

7. The network access node according to claim 1, wherein the first scrambling sequence is a radio network temporary identifier of the client device.

8. The network access node according to claim 1, wherein the method further comprises:
transmitting the first data packet in a physical downlink shared channel to the client device; or
receiving the first data packet in a physical uplink shared channel from the client device; and
transmitting the second data packet in a physical downlink control channel associated with the physical downlink or uplink shared channel to the client device.

9. The network access node according to claim 1, wherein the content type for the first data packet is associated with at least one of: a latency requirement and a reliability requirement.

10. A client device for a wireless communication system, the client device comprising a processor and a non-transitory memory coupled to the processor and having a processor-executable instructions stored thereon, which when executed, cause the client device to perform a method, comprising:
receiving a second data packet from a network access node, wherein the second data packet comprises a scrambled subset of bits among a set of bits;
descrambling the scrambled subset of bits in the second data packet using a first scrambling sequence associated with an identity of the client device, and determining a content type for a first data packet associated with the second data packet; and
receiving the first data packet from the network access node or transmitting the first data packet to the network access node,
wherein the set of bits is cyclic redundancy check parity bits arranged adjacent to payload bits in the second data packet,
wherein the scrambled subset of bits in the second data packet is a subset of the cyclic redundancy check parity bits with an offset of bits from the payload bits, wherein the offset of bits is based on the content type for the first data packet,
wherein remaining cyclic redundancy check parity bits not belonging to the scrambled subset of the cyclic redundancy check parity bits are scrambled with a second scrambling sequence, and
wherein the second scrambling sequence is used to avoid a false detection of another client device as the client device.

11. The client device according to claim 10, wherein the method further comprises:
calculating a metric for the payload bits in the second data packet;
descrambling a plurality of subset of bits in the set of bits using the first scrambling sequence to obtain a plurality of descrambled metrics; and
determining the content type for the first data packet based on a match between the metric for the payload bits and one of the plurality of descrambled metrics.

12. The client device according to claim 11, wherein the metric for the payload bits is a cyclic redundancy check for the payload bits.

13. The client device according to claim 11, wherein different subset of bits of the plurality of subset of bits correspond to different offsets of bits from the payload bits, and wherein different offsets of bits are associated with different content types for the first data packet.

14. The client device according to claim 10, wherein the cyclic redundancy check parity bits comprise 24 bits and the first scrambling sequence comprises 16 bits.

15. The client device according to claim 14, wherein each offset of bits from the payload bits is a 0 to 8 offset of bits.

16. The client device according to claim 10, wherein the first scrambling sequence is a radio network temporary identifier of the client device.

17. The client device according to claim 10, wherein the method further comprises:
receiving the first data packet in a physical downlink shared channel from the network access node; and
receiving the second data packet in a physical downlink control channel associated with the physical downlink shared channel from the network access node.

18. The client device according to claim 10, wherein the content type for the first data packet is associated with at least one of: a latency requirement and a reliability requirement.

19. A non-transitory computer-readable medium, having computer-executable instructions stored thereon, the computer-executable instructions, which when executed by one or more processor, cause a processor to facilitate:
obtaining a content type for a first data packet for a client device;
selecting a subset of bits among a set of bits in a second data packet associated with the first data packet based on the content type for the first data packet;
scrambling the selected subset of bits with a first scrambling sequence associated with an identity of the client device;
transmitting the second data packet to the client device; and
transmitting the first data packet to the client device or receiving the first data packet from the client device,
wherein the set of bits is cyclic redundancy check parity bits arranged adjacent to payload bits in the second data packet,
wherein selecting the subset of bits among the set of bits comprises:
selecting a subset of the cyclic redundancy check parity bits with an offset of bits from the payload bits, wherein the offset of bits is determined by the content type for the first data packet,
wherein remaining cyclic redundancy check parity bits not belonging to the selected subset of the cyclic redundancy check parity bits are scrambled with a second scrambling sequence, and wherein the second scrambling sequence is used to avoid a false detection of another client device as the client device.

\* \* \* \* \*

UNITED STATES PATENT AND TRADEMARK OFFICE
CERTIFICATE OF CORRECTION

PATENT NO. : 11,558,874 B2
APPLICATION NO. : 16/950657
DATED : January 17, 2023
INVENTOR(S) : Claeson et al.

It is certified that error appears in the above-identified patent and that said Letters Patent is hereby corrected as shown below:

In the Claims

Claim 6, Column 15, Line 14: "mod 2 for" should read -- mod2 for --.

Claim 6, Column 15, Line 19: "A" should read -- $A$ --.

Claim 6, Column 15, Line 20: "1" should read -- $l$ --.

Signed and Sealed this
Twenty-third Day of May, 2023

*Katherine Kelly Vidal*
Director of the United States Patent and Trademark Office